(12) United States Patent
Yamaguchi et al.

(10) Patent No.: US 11,939,482 B2
(45) Date of Patent: Mar. 26, 2024

(54) HIGHLY ELECTRICALLY CONDUCTIVE SILVER INK COMPOSITION AND WIRING OBTAINED USING SAME

(71) Applicant: DIC Corporation, Tokyo (JP)

(72) Inventors: Saori Yamaguchi, Sakura (JP); Yasuhiro Sente, Sakura (JP); Ken-ichi Yatsugi, Sakura (JP)

(73) Assignee: DIC CORPORATION, Tokyo (JP)

( * ) Notice: Subject to any disclaimer, the term of this patent is extended or adjusted under 35 U.S.C. 154(b) by 652 days.

(21) Appl. No.: 17/058,233

(22) PCT Filed: Aug. 30, 2018

(86) PCT No.: PCT/JP2018/032099
§ 371 (c)(1),
(2) Date: Nov. 24, 2020

(87) PCT Pub. No.: WO2019/239610
PCT Pub. Date: Dec. 19, 2019

(65) Prior Publication Data
US 2021/0155820 A1    May 27, 2021

(30) Foreign Application Priority Data

Jun. 12, 2018  (JP) ................. 2018-111957

(51) Int. Cl.
| | | |
|---|---|---|
| *C09D 11/52* | (2014.01) | |
| *C09D 11/033* | (2014.01) | |
| *C09D 11/037* | (2014.01) | |
| *C09D 11/103* | (2014.01) | |
| *C09D 11/14* | (2006.01) | |
| *H05K 1/09* | (2006.01) | |
| *H05K 3/12* | (2006.01) | |
| *H05K 3/22* | (2006.01) | |

(52) U.S. Cl.
CPC ............ *C09D 11/52* (2013.01); *C09D 11/033* (2013.01); *C09D 11/037* (2013.01); *C09D 11/103* (2013.01); *C09D 11/14* (2013.01); *H05K 1/092* (2013.01); *H05K 3/1216* (2013.01); *H05K 3/227* (2013.01)

(58) Field of Classification Search
CPC .............................. C09D 11/52; H05K 3/1233
See application file for complete search history.

(56) References Cited

U.S. PATENT DOCUMENTS

| | | | |
|---|---|---|---|
| 2010/0127223 A1 | 5/2010 | Dorfman | |
| 2014/0326929 A1 | 11/2014 | Hsueh et al. | |

FOREIGN PATENT DOCUMENTS

| | | | | |
|---|---|---|---|---|
| JP | 2012-509965 A | | 4/2012 | |
| JP | 2012-89252 A | | 5/2012 | |
| JP | 2012-089252 | * | 8/2012 | ............... H01B 1/22 |
| JP | 2014-220238 A | | 11/2014 | |
| KR | 101085487 B1 | * | 11/2011 | ........... H05K 3/1233 |
| WO | 2014/141741 A1 | | 9/2014 | |

OTHER PUBLICATIONS

International Search Report dated Oct. 2, 2018, issued in counterpart International Application No. PCT/JP2018/032099 (2 pages).

* cited by examiner

*Primary Examiner* — Dah-Wei D. Yuan
*Assistant Examiner* — Andrew J Bowman
(74) *Attorney, Agent, or Firm* — WHDA, LLP

(57) ABSTRACT

A conductive ink composition for screen printing contains a conductive metal particle (A) having an oleic acid surfactant, a non-chlorine-based resin composition (B), and an organic solvent (C), wherein the conductive metal particle (A) is contained in an amount of 45 to 70% by weight with respect to the total ink composition, the non-chlorine-based resin composition (B) has a number average molecular weight of 50,000 or more and is contained in an amount of 5 to 15% by weight with respect to the total ink composition, the organic solvent (C) has a flash point of 75 to 110° C. and is contained in an amount of 25 to 50% by weight with respect to the total ink composition, and the ink composition has an ink viscosity of 10 to 25 Pa·s (23° C.) at a shear rate of 100 s$^{-1}$.

5 Claims, No Drawings

HIGHLY ELECTRICALLY CONDUCTIVE SILVER INK COMPOSITION AND WIRING OBTAINED USING SAME

TECHNICAL FIELD

The present invention relates to a highly conductive silver ink composition and wiring using the highly conductive silver ink composition.

BACKGROUND ART

Printing methods or etching methods are known as methods for forming wiring such as wiring of electrodes and wiring used in touch panels, electronic paper and various electronic components.

Formation of wiring by the etching method requires the following process: a wired resist film is formed by photolithography on a substrate on which a variety of metal films are formed by vapor deposition; subsequently, the unnecessary part of the vapor deposited metal films is removed by chemical or electrochemical dissolution; and finally, the resist film is removed. Thus, this process is remarkably complicated, and the productivity is poor.

The printing method allows mass production of the desired wiring at a low cost. Furthermore, electric conductivity can be easily provided by drying or hardening a printed coating film. Flexographic printing, screen printing, gravure printing, gravure offset printing, inkjet printing and the like have been proposed as these printing methods in accordance with the line width, the thickness, and the production speed of the wiring to be formed.

Roll-to-Roll studies have been advancing in recent years in order to further improve the productivity of the printing method. In a conventional sheet-fed printing method of printing one sheet at a time, it takes 15 to 30 seconds per sheet because it is necessary to replace a base material each time. However, in the Roll-to-Roll printing method, it only takes a few seconds per sheet because the base material is continuously supplied.

Conductive inks suitable for the conventional sheet-fed type often require a baking time of 30 minutes, and when these inks are applied to Roll-to-Roll, a long baking furnace is required. This severely constricts the producing space, and thus is not realistic. The conductive ink required for Roll-to-Roll needs to exhibit electric conductivity in a baking time of about 60 seconds, which cannot be achieved with conventional inks.

Conductive metal powders such as gold, silver, and copper are used for such conductive inks. The smaller the particle size of these conductive metal powders immediately after production, the higher the degree of activation of the surface thereof. For example, the surface is easily oxidized in the presence of air or oxygen, and a thin film of metal oxide is formed on the metal surface. However, the thin film of metal oxide is inferior in electric conductivity to the metal itself, and thus it is indispensable to take measures to enhance the reduced conductivity.

In order to make the surface of the active conductive metal powder less likely to be exposed to air and oxygen, attempts have also been made to cover the surface of the conductive metal powder and suppress oxidation by adding long-chain fatty acids such as oleic acid and stearic acid. However, even with this method, the drawback that the electric conductivity is inferior to that of the metal itself was unavoidable.

In PTL 1, washing of a silver powder is repeated until the amount of fatty acid that can be extracted from the silver powder becomes 50 ppm or less. As a result, the catalytic activity of a cationic curing agent is improved, and the electric conductivity is enhanced. However, PTL 1 fails to mention that when extraction is performed until the amount of fatty acid becomes 50 ppm or less, the silver powders start to agglomerate and coarse particles increase in the ink.

In addition, the content of silver powder contained in the ink is 70 to 75% by weight, and the raw material cost is not low. Moreover, the binder resin used is a low molecular weight binder resin. Therefore, the ink composition is designed to have a high silver powder content and a non-volatile content of 80% by weight in order to impart screen printability.

In PTL 2, the electric conductivity is improved by heating at 110 to 150° C. for 5 to 1 hour to make the fatty acid that can be extracted from the silver powder become 100 ppm or less. However, PTL 2 also fails to mention the coarse particles that would occur.

Further, since the silver powder is in a spherical shape and the binder resin is a low molecular weight type binder resin, the ink composition is designed to have a silver powder content of 80% by weight or more and a non-volatile content of 90% by weight or more so as to impart printability. Therefore, the raw material cost cannot be low.

In PTL 3, in order to achieve high electric conductivity with a low film thickness after screen printing, an ink composition having a silver powder content of 64% by weight and a non-volatile content of 70% by weight, that is, a low silver powder content and a low non-volatile content, is obtained by defining the type of fatty acid of the silver powder and the shape of the silver powder, and further selecting a resin with a high molecular weight. However, the only resin that can be selected is polyvinylidene chloride, which is a chlorine-based resin.

As in PTL 3, it is well known that when designing an ink with a low silver powder content, it is necessary to select a binder resin that easily produces viscosity with a small amount, and that a chlorinated resin such as polyvinyl chloride (PVC), polyvinylidene chloride (PVDC), and a copolymer thereof is used in the binder resin in order to obtain the electric conductivity of a coating film by low-temperature baking at 150° C. or lower. This is because the decomposition reaction of the chlorinated resin, which usually occurs at 150° C. or higher, develops at about 120° C. due to the catalytic function of the silver powder. As a result, electric conductivity can be easily obtained. Desorption of chlorine ions having a large atomic radius causes electric conductivity to exhibit because the silver powders come closer to each other in the coating film. This phenomenon is also well understood from the fact that a large number of cyclic organic substances are produced in addition to silver chloride by analysis of the components of the coating film.

However, chlorinated resins are easily ionized as water approaches. They do not only induce silver ionization and contribute to migration, but are also classified as flame-retardant halogen substances. As a result, it is difficult to make a composition that meets green procurement standards of electronic device manufacturers.

In addition, stearic acid used on the surface of conductive metal powder has many achievements in aluminum pigments for metallic paints. It is known that by using a saturated fatty acid, aluminum particles are arranged at a high density on the surface of the coating film and high brightness can be obtained. The use of stearic acid in the silver ink composition is expected to "have promoted effective alignment" and have obtained a conductive path through the silver powders. However, no clear explanation has been given.

CITATION LIST

Patent Literature

PTL 1: Japanese Patent Application No. 2010-232437
PTL 2: Japanese Patent Application No. 2013-047869
PTL 3: Japanese Patent Application No. 2011-537679

SUMMARY OF INVENTION

Technical Problem

When designing a conductive ink at low cost, it is most effective to reduce silver powder, which accounts for 90% or more of the raw material cost. However, in order to maintain conductivity, the ratio of the silver powder to the binder resin must be maintained. When the ink composition has a low non-volatile content in order to reduce the cost, the total amount of the binder resin is inevitably reduced, and the viscosity is extremely lowered. As a result, it would be difficult to obtain appropriate screen printability.

In addition, commercially available conductive metal powders use an excessive amount of surface coating agents in order to maintain stability over time in a particle state. Therefore, it has been difficult to form a conductive path between the particles to obtain electric conductivity within a baking time of about 60 seconds such as in Roll-to Roll.

Solution to Problem

In the invention, a flake-shaped silver powder having a small particle size and a low tap density is essential in order to obtain a low-cost, highly conductive silver ink composition, and a binder resin having high molecular weight is indispensable for obtaining high viscosity with a small amount of the binder resin.

Moreover, the arrangement of the silver powders is desired to be random in order to increase the number of silver powder conductive paths in the coating film, and thus the oleic acid, which is an unsaturated fatty acid, is preferable on the surface of the silver powder. It is preferable that the oleic acid covers only the outermost surface of the silver powder, and it is difficult to obtain an effective conductive path when the surface of the silver powder is covered with a thick film. Therefore, it is necessary to leave a minimum amount of oleic acid which is necessary to maintain the particle state, and to remove excess fatty acids from the ink composition system before ink production.

That is, the invention provides the forming aspects.

(1) A conductive ink composition for screen printing, containing a conductive metal particle (A) having an oleic acid surfactant, a non-chlorine-based resin composition (B), and an organic solvent (C), wherein the conductive metal particle (A) is contained in an amount of 45 to 70% by weight with respect to the total ink composition, the non-chlorine-based resin composition (B) has a number average molecular weight of 50,000 or more and is contained in an amount of 5 to 15% by weight with respect to the total ink composition, the organic solvent (C) has a flash point of 75 to 110° C. and is contained in an amount of 25 to 50% by weight with respect to the total ink composition, and the ink composition has an ink viscosity of 10 to 25 Pa·s (23° C.) at a shear rate of 100 s$^{-1}$.

(2) The conductive ink composition for screen printing according to (1), wherein the conductive metal particle (A) having an oleic acid surfactant according to (1) has a flake-like shape, a median diameter of 1 to 8 µm, a specific surface area of 1.0 to 2.0 m$^2$/g, and a tap density of 1.5 to 4.0 g/cm$^3$.

(3) The conductive ink composition for screen printing according to (1) or (2), wherein the conductive metal particle (A) having an oleic acid surfactant according to (1) has an amount of free oleic acid of 100 to 350 ppm.

(l) A method for producing wiring, including a wiring forming step of printing the conductive link composition according to any one of (1) to (3) on a substrate to form wiring, and a drying step of drying the wiring.

(5) The method for producing wiring according to (4), wherein the drying step according to (4) is conducted at a drying temperature of 1.50° C. or lower and for a drying time of 30 minutes or less.

(6) A wiring, which is formed by using the conductive ink composition for screen printing according to any one of (1) to (3).

Advantageous Effects of Invention

Since the conductive ink composition of the invention has a low silver powder content in the ink composition, the conductive ink composition has a low raw material cost and has an appropriate high viscosity. Therefore, the conductive ink composition can be applied to screen printing, and a printed film can exhibit high electric conductivity of 20 µΩ·cm or less under an extremely short baking condition of 150° C. for 60 seconds.

DESCRIPTION OF EMBODIMENTS (Conductive Metal Powder)

Any known metal types can be used as the metal type of the conductive metal powder (A) used in the invention. For example, copper, gold, silver, aluminum, zinc, tin, lead, chromium, platinum, palladium, tungsten, molybdenum, etc., alloys and mixtures of two or more of these metals, or compounds of these metals having good electric conductivity can be mentioned. In particular, silver powder is preferable because it can easily achieve stable electric conductivity and has good thermal conductivity.

In the conductive metal powder (A) immediately after production, re-agglomeration of particles may occur due to surface activity, and, for example, the surface is easily oxidized in the presence of air or oxygen, and a thin film of metal oxide may be formed on the metal surface. In order to prevent such quality deterioration due to surface activity, it is necessary to coat the conductive metal powder (A) with, for example, a surfactant such as oleic acid and stearic acid.

The conductive metal powder (A) used in the invention is a conductive metal powder coated with an oleic acid surfactant. When the conductive metal powder and the oleic acid are mixed, a portion where the conductive metal powder and the oleic acid are bonded is formed. The reaction between the conductive metal powder and oleic acid can be carried out, for example, by bringing the two into contact with each other at 10 to 80° C. for 10 minutes to 24 hours. Theoretically, the reaction can be carried out by uniformly mixing the amount of oleic acid corresponding to the surface area of the conductive metal powder (A). The portion of the surface of the conductive metal powder (A) where the oleic acid and the metal are bonded is not easily separated from the metal itself existing inside the portion, and is integrated as the conductive metal powder (A).

In order to make the conductive metal powder easy to handle without agglomeration, the amount of oleic acid used is often unnecessarily in a large excess from the viewpoint of improving productivity by mixing both the conductive metal powder and the oleic acid uniformly in a short time.

However, since the oleic acid in a large excess covers the surface of the conductive metal powder (A) more than necessary, it hinders the proximity of the conductive particles (A) to each other after baking the coating film. As a result, it becomes difficult to form a conductive path, and the electric conductivity is deteriorated.

The inventors of the invention have found that printed wiring having more excellent electric conductivity can be formed by using a conductive metal powder in which oleic acid that was not used for bonding, in other words, free fatty acid randomly present on the metal surface other than the oleic acid bonded to the conductive metal powder, has been reduced.

When a commercially available conductive metal powder is used in forming printed wiring, the conductive particle (A) preferably has a free oleic acid content of 100 to 350 ppm. When the free oleic acid content is 100 ppm or less, innumerable coarse particles are generated in the conductive particles (A) and are mixed in the ink composition. When the free oleic acid content is 350 ppm or more, no effect is exhibited from the viewpoint of conductivity.

When the commercially available conductive metal powder which has been treated with oleic acid is not a suitable conductive metal powder as described above, it is necessary to reduce the amount of free oleic acid randomly present on the metal surface before using the conductive metal powder. As a method for this purpose, a known and commonly used method can be used. However, it is preferable to use, for example, a method of removing free fatty acids by heating the conductive metal powder from the viewpoint that waste solvent treatment is not required and this method is convenient as compared with a method of washing the conductive metal powder with an organic solvent that dissolves oleic acid.

The amount of free fatty acid contained in the conductive metal powder in the invention is calculated as follows.

1) 5 g of the conductive metal powder was mixed with 5 g of first grade reagent tetrahydrofuran (THF), and the mixture was placed in a glass container (inner diameter 20 mm, height 45 mm) with a lid.

2) The circular glass container was placed in an ultrasonic cleaning device (manufactured by Branson, Model No. 3510) and stirred at room temperature at a frequency of 42 kHz for 1 hour.

3) After completion of the stirring, the glass container was set in a centrifugal separator and centrifuged at room temperature at 1500 rpm for 10 minutes, and a supernatant (THF solution) was separated and collected as a sample solution.

4) 1 µL of the sample solution was collected using a microsyringe, and was subjected to GC-MS measurement of oleic acid (m/z 33 to 700 scans, Model No. GC2010 manufactured by SHIMADZU).

5) In gas chromatography-mass spectrometry (GC-MS) measurement, a standard sample solution having a predetermined concentration of oleic acid was prepared in advance and a calibration curve was prepared. An absolute mass of the free fatty acid contained in the conductive metal powder before mixing with THF was calculated from the numerical value detected in the measurement using the aforementioned sample solution. The amount of free fatty acid in the conductive metal powder (A) was calculated by dividing the absolute mass by the mass of the conductive metal powder before mixing with THF.

(Silver Powder)

When silver powder is used as the conductive metal powder (A) in the invention, it is preferable that the conductive metal powder (A) has a flake-like shape, a median diameter of 1 to 8 µm, a specific surface area of 1.0 to 2.0 $m^2/g$, and a tap density of 1.5 to 4.0 $g/cm^3$ from the viewpoint of electric conductivity and printability.

Examples of such commercially available silver powder include Table 1 below.

TABLE 1

| Product name | Median diameter µm | Specific surface area $m^2/g$ | Tap density $g/cm^3$ | Manufacturer name |
|---|---|---|---|---|
| FA-S-17 | 7.5 | 1.2 | 2.3 | DOWA Electronics |
| FA-S-18 | 3.0 | 1.9 | 2.7 | (Same as above) |
| AA-40723 | 2.9 | 1.6 | 2.9 | METALOR |
| AA-6293 | 4.3 | 1.8 | 2.4 | (Same as above) |
| AAM-54314 | 6.9 | 1.1 | 1.7 | (Same as above) |
| SF7M | 6.7 | 0.7 | 3.3 | AMES GOLDSMITH |
| SF9AL | 3.7 | 1.0 | 3.3 | (Same as above) |
| SF29 | 4.2 | 1.0 | 3.4 | (Same as above) |
| SF30 | 1.0 | 1.8 | 3.2 | (Same as above) |
| SF70A | 1.9 | 1.3 | 3.4 | (Same as above) |

By processing a commercially available conductive metal powder other than the above, it is possible to put the commercially available conductive metal powder within the scope of the invention. That is, it can be obtained by milling at a high speed a spherical or flake-shaped silver powder having a median diameter of 0.5 to 5.0 µm in the presence of oleic acid by a dry method or a wet method using a known device such as a bead mill, a ball mill, and an attritor. The beads used for dispersion are preferably zirconia having a diameter of 0.1 to 3.0 mm or silica beads.

The above spherical silver powder can also be prepared from an aqueous sodium hydroxide solution in which silver nitrate is dissolved by a reduction precipitation method using an aqueous solution of formalin or the like.

When any silver powder is used as the conductive metal powder of the invention, the amount of free oleic acid is determined by the aforementioned method. When the free oleic acid is contained, it is preferable to, for example, heat at 120 to 180° C. for 5 to 1 hour to reduce the free oleic acid contained in the conductive metal powder before use.

In the case of a fatty acid containing an intramolecular double bond such as oleic acid, the carbon chain may be cleaved at the double bond portion and a fatty acid having a shorter chain length may be generated. In such a case, a site where a fatty acid having a shorter chain length and a metal are bonded may also be formed on the surface of the conductive metal powder. Such a material can also be used as the conductive metal powder (A) in the invention.

The blending amount of the conductive metal powder (A) is preferably 45 to 70% by weight, more preferably 45 to 60% by weight, with respect to the total ink composition. The blending amount of the conductive metal powder (A) occupying 90% of the raw material cost of the conductive ink composition is preferably as small as possible within the range from the viewpoint of cost reduction. When the amount is 45% by weight or less, it is in fact difficult to increase the viscosity enough to obtain screen printability, and thus is not preferable.

(Non-Chlorine-Based Resin Composition)

Further, the conductive ink of the invention contains the non-chlorine-based resin composition (B). The non-chlorine-based resin composition (B) forms a resin film after printing, and fixes the conductive metal powder (A) on a printed matter which will be described later.

Since the conductive ink of the invention needs to have a high viscosity that allows screen printing while having a low non-volatile content, it is preferable that the non-chlorine-based resin composition (B) used in the ink composition has a number average molecular weight of 50,000 or more. When the number average molecular weight is 50,000 or less, the ink composition does not have a high viscosity and the screen printability becomes insufficient, or the ink composition would have a high non-volatile content when the viscosity is adjusted to a high viscosity.

The non-chlorine-based resin composition (B) preferably forms a good film by itself. It is preferable that the non-chlorine-based resin composition (B) is solid at 50° C. and is soluble in the organic solvent (C) which will be described later.

Examples of the non-chlorine-based resin composition (B) include various synthetic resins, such as polyesters, homopolymers of (meth) acrylic esters, copolymers of (meth) acrylic esters with other unsaturated double bond-containing monomers, copolymers of polystyrene or styrene monomers with other unsaturated double bond-containing monomers, ketone-formaldehyde condensates and hydrogenated products thereof, polyvinyl acetal, polyvinyl butyral, polyurethane, and ethyl cellulose. These can be used alone or in combination of one or more selected therefrom.

Examples of commercially available products of the non-chlorine-based resin composition (B) include Table 2 below.

TABLE 2

| Resin type | Product name | Grade name | Number average molecular weight | Manufacturer name |
|---|---|---|---|---|
| Polyvinyl butyral | S-LEC | BH-A | 115,000 | SEKISUI CHEMICAL CO., LTD. |
| (Same as above) | (Same as above) | BX-1 | 100,000 | (Same as above) |
| Polyvinyl acetal | (Same as above) | KS-6Z | 108,000 | (Same as above) |
| (Same as above) | (Same as above) | KS-5Z | 130,000 | (Same as above) |
| Ethyl cellulose | ETHOCEL | STD-100 | 63,420 | DOW CHEMICAL |
| (Same as above) | ETHOCEL | STD-200 | 80,733 | (Same as above) |

The blending amount of the non-chlorine-based resin composition (B) is preferably 4.5 to 7.0% by weight with respect to the total ink composition. When the non-chlorine-based resin composition (B) is blended in an amount more than 7.0% by weight in order to increase the viscosity to obtain screen printability, the non-chlorine-based resin composition (B) is excessively present relative to the conductive metal powder (A), and the electric conductivity of a coating film using the conductive ink composition decreases. When the non-chlorine-based resin composition (B) is blended in an amount of 4.5% by weight or less in order to improve the electric conductivity of the coating film, the conductive ink composition cannot have such a high viscosity that screen printability can be obtained.

For example, when the non-chlorine-based resin composition (B) having a reactive group such as a glycidyl group and a hydroxyl group is blended with the conductive metal powder (A) which has been heated at 120 to 180° C. for 5 to 1 hour, it is not necessary to add a curing agent and a curing aid that react with the non-chlorine-based resin composition (B). This is because reactive groups of the non-chlorine-based resin composition (B) undergo a self-reaction and the solvent resistance is improved due to the catalytic effect of the conductive metal powder (A) from which free oleic acid has been removed, or the conductive metal powder (A) activated by heating.

The conductive ink composition of the invention, which does not contain a curing agent or a curing aid, hardly causes a change in viscosity with time at room temperature and under a heating acceleration test at 40° C. or 50° C.

(Organic Solvent)

In order to adjust the viscosity and coatability, etc, the conductive ink composition of the invention contains the organic solvent (C) which has a flash point of 75° 110° C. at normal pressure and is capable of dissolving the non-chlorine-based resin composition (B) while being not reactive with the non-chlorine-based resin composition (B). When the flash point is 75° C. or lower, the ink viscosity easily increases on a printing plate during screen printing, and the line width formed by printing tends to become smaller as the number of continuous prints increases. When the flash point is higher than 110° C., in the short-time baking for 60 seconds, which is an object of the invention, the solvent does not fly out into the coating film but remains in the coating film, and high electric conductivity cannot be obtained.

Any known and commonly used organic solvents can be used as the organic solvent (C), such as glycol ether, glycol ether acetate, glycol diether, and ester. Among these organic solvents, it is preferable to select an organic solvent suitable for screen printing so as not to encroach on emulsion of the screen plate or rubber squeegee. These organic solvents can be used alone or in combination of one or more selected therefrom.

Examples of commercially available products of the organic solvent (C) include Table 3 below.

TABLE 3

| Chemical name | Flash point ° C. | Boiling point ° C. | Abbreviation |
|---|---|---|---|
| Diethylene glycol monoethyl ether acetate | 105 | 217 | EDGAc |
| Tripropylene glycol dimethyl ether | 104 | 215 | MTPOM |
| Dibasic acid ester | 103 | 215 | DBE |
| Diethylene glycol butyl methyl ether | 94 | 212 | BDM |
| Diethylene glycol monoethyl ether | 97 | 202 | EDG |
| Diethylene glycol monomethyl ether | 93 | 194 | DM |
| Ethylene glycol monobutyl ether acetate | 83 | 100 | BMGAc |
| Dipropylene glycol monomethyl ether | 79 | 188 | DPM |

The content of the organic solvent (C) in the conductive ink of the invention is not particularly limited as long as it is in a range where the screen printability can be obtained. However, in order to reduce the raw material cost, it is desirable to reduce the non-volatile content of the ink as much as possible. Therefore, the content is preferably 23 to 49.5% by weight. Within this range, the ink viscosity becomes more appropriate, and it is possible to form good printing wiring without bleeding or thickening of image lines in screen printing.

The conductive ink of the invention contains the organic solvent (C) which has a high boiling point. However, since the printed wiring formed by screen printing has a very thin film thickness of 5 to 15 μm, the organic solvent (C) can be sufficiently removed by heating to a temperature close to the flash point without heating to the boiling point of the actually used organic solvent (C) contained in the conductive ink.

(Ink Viscosity)

In screen printing, the ink forms a printing shape with two major state changes. That is,
1. The ink makes a certain rotation on the printing plate and moves forward to fill openings of screen meshes.
2. After filling, the printing plate is peeled off, so that an ink remaining on the substrate retains its shape.

By adjusting the ink viscosity suitable to the change of state of the ink during printing as described above, it is possible to obtain a printed matter having good linearity, less bleeding, and less line thickening.

It is optimal that the ink viscosity for screen printing is 35 Pa·s or more at a shear rate of 1 s$^{-1}$ and the ink viscosity is 10 to 25 Pa·s at the same shear rate of 100 s$^{-1}$.

In addition to the above-mentioned components, various additives such as dispersants, antifoaming agents, release agents, leveling agents, and plasticizers can be appropriately blended in appropriate amounts in the conductive ink of the invention as needed.

The conductive ink of the invention can form wiring by, for example, applying or printing on any substrate such as a plastic film, a ceramic film, a silicon wafer, glass and a metal plate by any method. However, the true value of the conductive ink of the invention can be fully exhibited only when, during obtaining the wiring, the substrate is a PET film that cannot be exposed to high temperature, or a transparent conductive film such as an ITO film which uses the PET film as a support.

In preparing the conductive ink of the invention, when the substrate to be printed is inferior in heat resistance like a plastic film, it is preferable that the conductive ink does not contain an inorganic binder such as glass frit, which has a function of melting below the melting point of the conductive metal powder (A) and binding the conductive metal powder (A) to the substrate. In the conductive ink of the invention, it is intended to fix the conductive metal powder (A) to the substrate based solely on the non-chlorine-based resin composition (B). When the inorganic binder is contained, the content of the conductive metal powder (A) itself has to be reduced. As a result, it becomes difficult to achieve excellent electric conductivity based on the content, and the fixation to the substrate is reduced. Therefore, it is not preferable.

Electric conductivity can be obtained by baking printed wiring corresponding to the wiring formed on the substrate in the screen printing. In the baking, the removal of the organic solvent (C) contained in the ink and the film formation of the non-chlorine-based resin composition (B) may be performed in this order, or may be performed simultaneously.

In the removal of the organic solvent (C) and the film formation of the non-chlorine-based resin composition (B), a known and commonly used method can be adopted, such as heating with a heat source, irradiation with a xenon flash lamp, irradiation with ultra-short waves, irradiation with near infrared rays, and irradiation with far infrared rays. When a PET film that cannot be exposed to high temperature, or a transparent conductive film such as an ITO film which uses the PET film as a support is used as a substrate, it is preferable to select an ink raw material and perform baking at 150° C. or lower so that the aforementioned curing reaction is performed at 150° C. or lower to form a film.

Thus, the printed wiring provided on the substrate using a thermosetting conductive ink suitable in the invention becomes a fired printed wiring and exhibits electric conductivity by heating at 80 to 150° C. for 5 to 10 minutes using a box oven, for example, to form a cured film.

Moreover, in the case of baking using a Roll-to-Roll oven equipped with a film winding and unwinding function, that is, a reel oven, the printed wiring becomes a fired printed wiring and exhibits electric conductivity by heating at 80 to 150° C. for 30 to 90 seconds to form a cured film.

As described above, since the wiring using the suitable conductive ink of the invention can be formed at a low temperature and in a short time, the characteristics of the suitable conductive ink of the invention are particularly remarkably exhibited when wiring is formed on a non-heat-resistant substrate which has lower heat resistance and is more likely to be thermally deformed as compared with substrates having high heat resistance such as ceramic films, glass, and metal plates. Thus, the wiring formed from the cured film of the suitable conductive ink of the invention on the non-heat-resistant substrate can be suitably used as the wiring formed on a non-heat-resistant substrate.

In this way, various substrates provided with wiring formed by the screen printing method can be used as various electrical components and electronic components with the conductive ink of the invention as wiring, and further by performing wiring and the like as necessary.

Examples of final products in which the conductive ink of the invention is used include electronic devices such as touch sensors, RFID, sensors, thin-film solar cells, electronic paper, and organic EL lighting.

Examples

Examples and comparative examples will be described. Here, "%" is "% by weight" unless otherwise specified.

(Silver Powder)

For silver powders A to C, commercially available silver powders were used as they were. Silver powders D to E were obtained by heating the silver powder C and changing the content of free oleic acid. The silver powder D was heated at 160° C. for 90 minutes, and the silver powder E was heated at 160° C. for 150 minutes. Compared with a method for producing silver powder in which conductive metal powder is washed with an organic solvent that dissolves oleic acid, the aforementioned method for producing silver powder did not require treatment of a waste solvent generated when oleic acid was extracted, and unit operation was simpler. The respective physical property values and the amount of free oleic acid are shown in Table 4.

TABLE 4

|  | Silver powder A | Silver powder B | Silver powder C | Silver powder D | Silver powder E |
|---|---|---|---|---|---|
| (1) Fatty acid type | Oleic acid | Oleic acid | Oleic acid | Oleic acid | Oleic acid |
| (2) Shape | Spherical | Flake | Flake | Flake | Flake |
| (3) Median diameter (μm) | 1 | 7.5 | 3.1 | 3 | 2.9 |

TABLE 4-continued

|  | Silver powder A | Silver powder B | Silver powder C | Silver powder D | Silver powder E |
|---|---|---|---|---|---|
| (4) Specific surface area (m²/g) | 1 | 0.28 | 2.1 | 1.9 | 2 |
| (5) Tap density (g/ml) | 5.5 | 5.2 | 3 | 2.7 | 2.9 |
| (6) Free oleic acid amount (ppm) | 600 | 3500 | 1500 | 250 | 70 |

The median diameter was measured using MICROTRAC MT3000II series manufactured by MicrotracBEL Corporation.

The specific surface area was measured in accordance with JIS Z 8830 using BELSORP-MR6 manufactured by MicrotracBEL Corporation.

The tap density was measured in accordance with JIS Z 2512.

(Resin)

Commercially available resins were used as they were as resins a to e. Details of the resins are shown in Table 5.

TABLE 5

|  | Resin a | Resin b | Resin c | Resin d | Resin e |
|---|---|---|---|---|---|
| (1) Brand | VYLON | ETHOCEL | S-LEC | SOLBIN | Saran resin |
| (2) Product No. | GK640 | STD-200 | KS-6Z | AL | F310 |
| (3) Resin name | Polyester | Ethyl celluluse | Acetal | PVC | PVDC |
| (4) Number average molecular weight | 18,000 | 80,000 | 108,000 | 27,000 | 80,000 |
| (5) Presence or absence of chlorine | Absent | Absent | Absent | Present | Present |

Catalog values of each company were used for the number average molecular weight.

The presence or absence of chlorine was determined in accordance with JIS K 7229. According to this determination method, a resin having a chlorine content of 1000 ppm or more was noted with "present", and a resin having a chlorine content of 1000 ppm or less was noted with "absent".

(Solvent)

Commercially available solvents were used as they were as solvents I to V. Details of the solvents are shown in Table 6.

Catalog values of each company were used for the flash point and boiling point of the solvents.

TABLE 6

|  |  | Flash point ° C. | Bpiling point ° C. |
|---|---|---|---|
| Solvent I | Dibasic acid ester | 103 | 215 |
| Solvent II | Diethylene glycol monoethyl ether acetate | 83 | 188 |
| Solvent III | Diethylene glycol monobutyl ether acetate | 124 | 247 |
| Solvent IV | Diethylene glycol ethyl methyl ether | 63 | 176 |
| Solvent V | Diethylene glycol diethyl ether | 82 | 189 |

Each conductive ink of the invention as an example and each conventional conductive ink as a comparative example were prepared by sufficiently mixing raw materials in percentage by weight as shown in the following Tables 7 to 8.

For each of these conductive inks, properties of the conductive inks were evaluated for the following measurement items. The evaluation results are collectively shown in Tables 7 to 8 below.

(Viscosity)

The viscosity of each conductive ink at 25° C. at a shear rate of 100 s$^{-1}$ was measured using a rotary rheometer.

(Volume Resistivity)

The conductive ink was applied to a rear surface (untreated surface) of a PET film COSMOSHINE A4100 manufactured by TOYOBO Co., Ltd. using an applicator so as to provide a film thickness of 8 μm after baking, and then was baked in a reel oven at 150° C. for 60 seconds. The baked coating film was measured with a Loresta GP MCP-T610 (manufactured by Mitsubishi Chemical Corporation) by a four-point probe method. The volume resistivity is a measure of conductivity.

(Adhesion)

An ink coating film prepared as in the evaluation of the volume resistivity on the rear surface of a PET film COSMOSHINE A4100 manufactured by TOYOBO Co., Ltd. was subjected to testing in accordance with JIS K5600-5-45 and was evaluated according to the evaluation criteria.

(Printability)

A wiring having a line width of 50 to 200 μm was prepared using a screen printing machine. In the aforementioned wiring, lines having a line width of 100 μm were observed with a microscope, and the thin line reproducibility was evaluated in accordance with the following criteria.

Good: The linearity of the lines is excellent and there are no blurring, bleeding, or disconnected parts.

Poor: The linearity of the lines is poor and there are blurring, bleeding, and disconnected parts.

Examples

TABLE 7

|  | Example 1 | Example 2 | Example 3 | Example 4 |
|---|---|---|---|---|
| (A)-1. Silver type | D | D | D | D |
| (A)-2. Silver content (%) | 58.5 | 54.5 | 54.5 | 54.5 |
| (B)-1. Silver type | b | c | c | C |
| (B)-2. Resin content (%) | 6.0 | 5.5 | 5.5 | 5.5 |
| (C)-1. Solvent type | I | II | II | V |
| (C)-2. Solvent content (%) | 35.5 | 40 | 40 | 40 |
| 4. Viscosity (Pa · s) | 18 | 25 | 20 | 19 |
| 5. Volume resistivity (μΩ · cm) | 12 | 10 | 10 | 9 |
| 6. Substrate adhesion (classification) | 1 | 1 | 1 | 1 |
| 7. Printability | Good | Good | Good | Good |

The conductive inks used in Examples 1 to 4 had an appropriate viscosity, and the obtained wirings had a low volume resistivity, good substrate adhesion, and good printability.

Comparative Examples

TABLE 8

|  | Com. Ex. 1 | Com. Ex. 2 | Com. Ex. 3 | Com. Ex. 4 | Com. Ex. 5 | Com. Ex. 6 | Com. Ex. 7 | Com. Ex. 8 | Com. Ex. 9 | Com. Ex. 10 |
|---|---|---|---|---|---|---|---|---|---|---|
| (A)-1. Silver type | D | D | D | D | D | D | A | B | C | E |
| (A)-2. Silver content (%) | 54.5 | 54.5 | 54.5 | 63.5 | 63.5 | 63.5 | 54.5 | 54.5 | 54.5 | 54.5 |
| (B)-1. Resin type | c | c | c | c | d | a | c | c | c | c |
| (B)-2. Resin content (%) | 5.5 | 5.5 | 20 | 9.5 | 9.5 | 9.5 | 5.5 | 5.5 | 5.5 | 5.5 |
| (C)-1. Solvent type | III | IV | I | I | I | I | I | I | I | I |
| (C)-2. Solvent content (%) | 40 | 40 | 34.5 | 27 | 27 | 27 | 40 | 40 | 40 | 40 |
| 4. Viscosity (Pa·s) | 30 | 20 | 55 | 20 | <5 | <5 | <5 | <5 | 20 | 15 |
| 5. Volume resistivity (μΩ·cm) | 35 | 10 | 45 | 10 | 25 | 40 | 80 | 100 | 60 | 35 |
| 6. Substrate adhesion (classification) | 1 | 1 | 1 | 1 | 1 | 1 | 1 | 1 | 1 | 3 |
| 7. Printability | Good | Poor | Poor | Good | Poor | Poor | Poor | Poor | Good | Poor |

In Comparative Example 1, the flash point of the solvent is too high, and thus the electric conductivity obtained after baking is insufficient.

In Comparative Example 2, the flash point of the solvent is too low, and thus ink drying occurs on the printing plate during printing and the image shape is poor.

In Comparative Example 3, the amount of resin is too large, and thus the ink viscosity is high and the image shape is poor.

Comparative Example 4 is not suitable for the purpose of the invention because it uses a chlorinated resin as the resin.

In Comparative Example 5, a chlorinated resin is used and the molecular weight is low, and thus the viscosity is low and the image shape is poor.

In Comparative Example 6, the molecular weight of the resin is low, and thus the ink viscosity is low and the image shape is poor.

In Comparative Example 7, spherical silver is used, and thus the ink viscosity is low, the amount of free oleic acid is insufficient, and the electric conductivity is low.

In Comparative Example 8, the specific surface area is low and the tap density is high, and thus the ink viscosity is low. In addition, the operation of releasing the amount of oleic acid is insufficient, and the electric conductivity is poor.

In Comparative Example 9, the operation of releasing the amount of oleic acid is insufficient, and the electric conductivity is poor.

In Comparative Example 10, the operation of releasing the amount of oleic acid is excessive, and there are many coarse particles in the ink and there are many defects in the printed matter.

The invention claimed is:

1. A conductive ink composition for screen printing, comprising a conductive metal particle (A) having an oleic acid surfactant, a non-chlorine-based resin composition (B), and an organic solvent (C), wherein
   the conductive metal particle (A) has an amount of free oleic acid of 100 to 350 ppm and is contained in an amount of 45 to 70% by weight with respect to the total ink composition,
   the non-chlorine-based resin composition (B) has a number average molecular weight of 50,000 or more and is contained in an amount of 5 to 15% by weight with respect to the total ink composition,
   the organic solvent (C) has a flash point of 75 to 110° C. and is contained in an amount of 25 to 50% by weight with respect to the total ink composition, and
   the ink composition has an ink viscosity of 10 to 25 Pa·s (23° C.) at a shear rate of 100 s$^{-1}$.

2. The conductive ink composition for screen printing according to claim 1, wherein the conductive metal particle (A) has a shape of a flake, a median diameter of 1 to 8 μm, a specific surface area of 1.0 to 2.0 m²/g, and a tap density of 1.5 to 4.0 g/cm³.

3. A method for producing wiring, comprising,
   a wiring forming step of printing the conductive ink composition according to claim 1 on a substrate to form wiring, and
   a drying step of drying the wiring.

4. The method for producing wiring according to claim 3, wherein the drying step is conducted at a drying temperature of 150° C. or lower and for a drying time of 30 minutes or less.

5. A wiring, which is formed by using the conductive ink composition for screen printing according to claim 1.

* * * * *